United States Patent
Eroz et al.

(10) Patent No.: US 8,140,946 B2
(45) Date of Patent: *Mar. 20, 2012

(54) METHOD AND APPARATUS FOR GENERATING LOW RATE TURBO CODES

(75) Inventors: Mustafa Eroz, Germantown, MD (US); Lin-Nan Lee, Potomac, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 1095 days.

This patent is subject to a terminal disclaimer.

(21) Appl. No.: 12/017,219

(22) Filed: Jan. 21, 2008

(65) Prior Publication Data

US 2008/0238730 A1 Oct. 2, 2008

Related U.S. Application Data

(60) Provisional application No. 60/908,340, filed on Mar. 27, 2007.

(51) Int. Cl.
*H03M 13/03* (2006.01)
(52) U.S. Cl. ........ 714/786; 714/747; 714/751; 714/752; 714/755; 714/781; 714/785; 714/790
(58) Field of Classification Search .................. None
See application file for complete search history.

(56) References Cited

U.S. PATENT DOCUMENTS

| | | | |
|---|---|---|---|
| 6,400,703 B1 * | 6/2002 | Park et al. ...................... 370/342 |
| 2003/0106011 A1 * | 6/2003 | Miyauchi et al. .............. 714/780 |
| 2003/0140304 A1 * | 7/2003 | Hurt et al. ...................... 714/786 |
| 2005/0172202 A1 * | 8/2005 | Eroz et al. ...................... 714/755 |
| 2010/0235712 A1 * | 9/2010 | Bhushan ........................ 714/755 |

* cited by examiner

*Primary Examiner* — John Trimmings
(74) *Attorney, Agent, or Firm* — Ditthavong Mori & Steiner, P.C.

(57) ABSTRACT

An approach is provided for encoding information bits to output a coded signal using turbo code encoding with a low code rate.

15 Claims, 13 Drawing Sheets

METHOD AND APPARATUS FOR GENERATING LOW RATE TURBO CODES

RELATED APPLICATIONS

This application is related to, and claims the benefit of the earlier filing date under 35 U.S.C. §119(e) of, U.S. Provisional Patent Application (Ser. No. 60/908,340) filed Mar. 27, 2007, entitled "Efficient USAT Transmission Using Low-Rate Turbo Codes and Scrambled Coded Multiple Access (SCMA) Techniques"; the entirety of which is incorporated herein by reference.

FIELD OF THE INVENTION

The present invention relates to communication systems, and more particularly to coded systems.

BACKGROUND OF TUE INVENTION

Nearly all communication system relies on some form of error control for managing errors that may occur due to noise and other factors during transmission of information through a communication channel. These communications systems can include satellite systems, fiber-optic systems, cellular systems, and radio and television broadcasting systems. Efficient error control schemes implemented at the transmitting end of these communications systems have the capacity to enable the transmission of data including audio, video, text, etc. with very low error rates within a given signal-to-noise ratio (SNR) environment. Powerful error control schemes also enable a communication system to achieve target error performance rates in environments with very low SNR, such as in satellite and other wireless systems where noise is prevalent and high levels of transmission power are costly, if even feasible.

Thus, a broad class of powerful error control schemes that enable reliable transmission of information have emerged including convolutional codes, low density parity check (LDPC) codes, and turbo codes. Both LDPC codes as well as some classes of turbo codes have been successfully demonstrated to approach near the theoretical bound (i.e., Shannon limit). Although long constraint length convolutional codes can also approach the Shannon limit, decoder design complexity prevents practical, wide spread adoption. LDPC codes and turbo codes, on the other hand, can achieve low error rates with lower complexity decoders. Consequently, these codes have garnered significant attention.

Code rate is an important factor that has a significant effect on the error performance of the code. The choice of which code rate to operate, in turn, depends on the SNR of the environment in which the codes will be deployed. Traditionally, low SNR environments require the use of low code rates (i.e., more redundancy), whereas high SNR environments can enable the utilization of higher code rates. There is a continual challenge to devise codes that edge closer to the Shannon limit, while minimizing complexity.

Based on the foregoing, there is a need for generating low rate codes for use within various types of communication systems.

SUMMARY OF THE INVENTION

These and other needs are addressed by the present invention, wherein a method is provided for generating turbo codes with low code rates.

According to one aspect of an embodiment of the present invention, a method comprises encoding information bits to output a coded signal using turbo code encoding with a low code rate, wherein the encoding utilizes constituent encoding having a transfer function:

$$G(D) = \left[\frac{n_0(D)}{d(D)}, \frac{n_1(D)}{d(D)}, \ldots \frac{n_4(D)}{d(D)}\right],$$

where, $d(D)=1+D+D^3$ $n_0(D)=1+D^2+D^3$ $n_1(D)=1+D+D^2+D^3$ $n_2(D)=1+D^3$ $n_3(D)=1+D+D^2$ $n_4(D)=1+D$ According to another aspect of an embodiment of the present invention, a method comprises encoding information bits to output a coded signal using turbo code encoding with a low code rate, wherein the encoding utilizes constituent encoding having a transfer function:

$$G(D) = \left[\frac{n_0(D)}{d(D)}, \frac{n_1(D)}{d(D)}, \ldots \frac{n_6(D)}{d(D)}\right],$$

where, $d(D)=1+D^3$ $n_0(D)=1$ $n_1(D)=1+D^2$ $n_2(D)=1+D^2+D^3$ $n_3(D)=1+D+D^2+D^3$ $n_4(D)=1+D+D^3$ $n_5(D)=1+D+D^2$ $n_6(D)=1+D$ According to another aspect of an embodiment of the present invention, a system comprises a detector configured to receive encoded signals from a plurality of terminals each configured to encode information bits to output a coded signal using turbo code encoding with a low code rate. The system also comprises a plurality of turbo code decoders configured to exchange information with the detector to decode the encoded signals, wherein the turbo encoding utilized one of a plurality of transfer functions specified according to the following table:

$$G(D) = \left[\frac{n_0(D)}{d(D)}, \frac{n_1(D)}{d(D)}, \ldots \frac{n_4(D)}{d(D)}\right]$$

where,
$d(D) = 1 + D + D^3$
$n_0(D) = 1 + D^2 + D^3$
$n_1(D) = 1 + D + D^2 + D^3$ -continued $$n_2(D) = 1 + D^3$$
$$n_3(D) = 1 + D + D^2$$
$$n_4(D) = 1 + D.$$

$$G(D) = \left[\frac{n_0(D)}{d(D)}, \frac{n_1(D)}{d(D)}, \cdots \frac{n_6(D)}{d(D)}\right]$$

where,
$$d(D) = 1 + D^3$$
$$n_0(D) = 1$$
$$n_1(D) = 1 + D^2$$
$$n_2(D) = 1 + D^2 + D^3$$
$$n_3(D) = 1 + D + D^2 + D^3$$
$$n_4(D) = 1 + D + D^3$$
$$n_5(D) = 1 + D + D^2$$
$$n_6(D) = 1 + D.$$

According to yet another aspect of an embodiment of the present invention, a method comprises receiving encoded signals from a plurality of terminals each configured to encode information bits to output a coded signal using turbo code encoding with a low code rate. The method also comprises decoding the encoded signals, wherein the turbo encoding utilized one of a plurality of transfer functions specified according to the following table:

$$G(D) = \left[\frac{n_0(D)}{d(D)}, \frac{n_1(D)}{d(D)}, \cdots \frac{n_4(D)}{d(D)}\right]$$

where,
$$d(D) = 1 + D + D^3$$
$$n_0(D) = 1 + D^2 + D^3$$
$$n_1(D) = 1 + D + D^2 + D^3$$
$$n_2(D) = 1 + D^3$$
$$n_3(D) = 1 + D + D^2$$
$$n_4(D) = 1 + D.$$

$$G(D) = \left[\frac{n_0(D)}{d(D)}, \frac{n_1(D)}{d(D)}, \cdots \frac{n_6(D)}{d(D)}\right]$$

where,
$$d(D) = 1 + D^3$$
$$n_0(D) = 1$$
$$n_1(D) = 1 + D^2$$
$$n_2(D) = 1 + D^2 + D^3$$
$$n_3(D) = 1 + D + D^2 + D^3$$
$$n_4(D) = 1 + D + D^3$$
$$n_5(D) = 1 + D + D^2$$
$$n_6(D) = 1 + D.$$

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF PREFERRED EMBODIMENTS

A method for generating low rate turbo codes is described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

Figure 1:
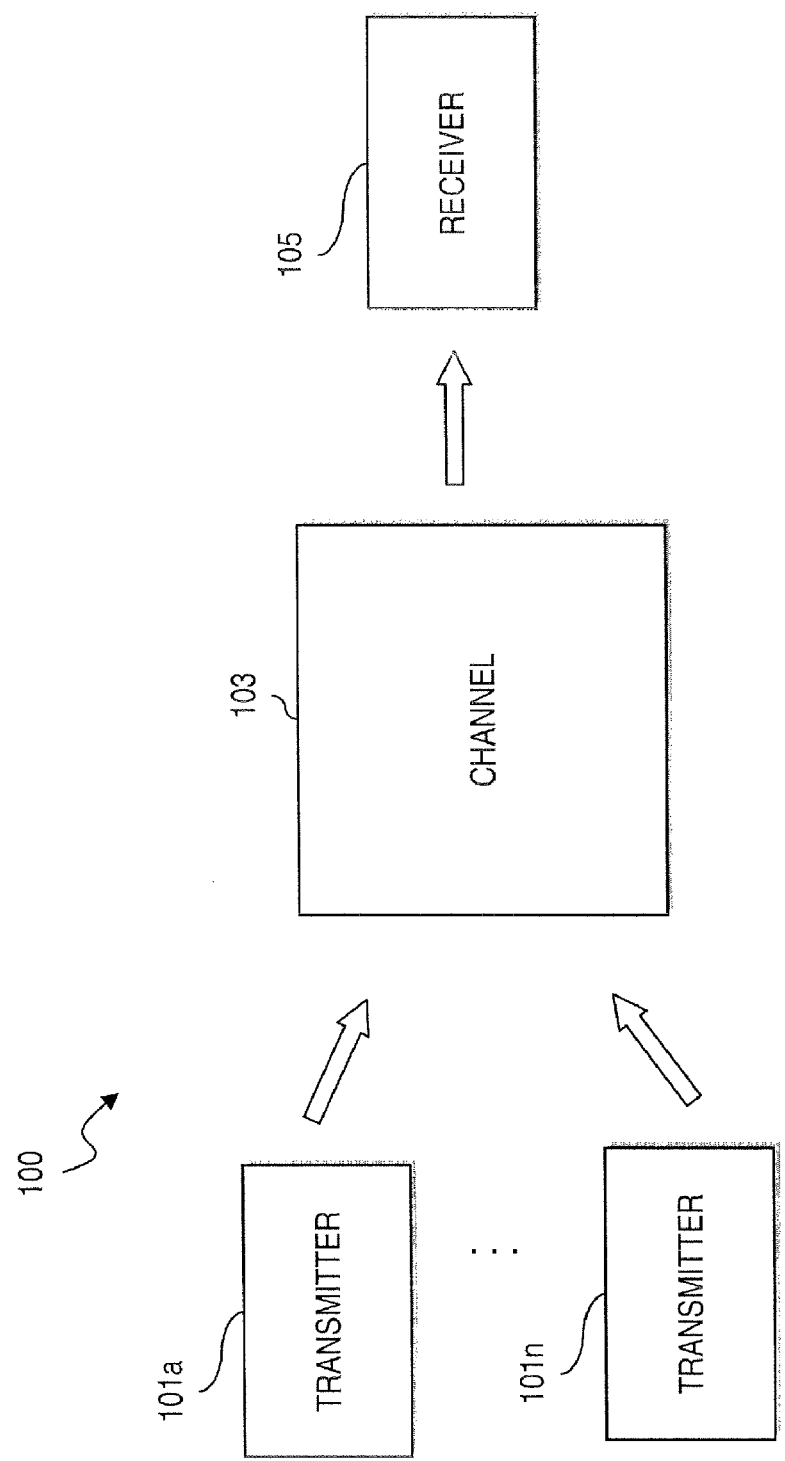
FIG. 1 is a diagram of a communications system configured to utilize low rate turbo codes, according to various exemplary embodiments.

FIG. 1 is a diagram of a communications system configured to utilize low rate turbo codes, according to various exemplary embodiments. A digital communications system 100 includes one or more transmitters 101 that generate signal waveforms across a communication channel 103 to one or more receivers 105 (of which one is shown). In this discrete communications system 100, the transmitter 101 has a message source that produces a discrete set of possible messages; each of the possible messages has a corresponding signal waveform. These signal waveforms are attenuated, or otherwise altered, by communications channel 103. To combat the noise channel 103, coding is utilized. For example, forward error correction (FEC) codes can be employed.

Forward error correction (FEC) is required in terrestrial and satellite ratio systems to provide high quality communication over a radio frequency (RF) propagation channel, which induces signal waveform and spectrum distortions, including signal attenuation (freespace propagation loss) and multi-path induced fading. These impairments drive the design of the radio transmission and receiver equipment, the design objective which is to select modulation formats, error control schemes, demodulation and decoding techniques and hardware components that together provide an efficient balance between system performance and implementation complexity. Differences in propagation channel characteristics, such as between terrestrial and satellite communication channels, naturally result in significantly different system designs. Likewise, existing communication systems continue to evolve in order to satisfy increased system requirements for new higher rate or higher fidelity communication services.

When considering turbo codes and LDPC codes, irregular LDPC codes have been demonstrated to achieve superior performance over turbo codes for high code rates, whereas turbo codes have been demonstrated to be superior for lower code rates in low SNR environments. For very low codes such as ⅙ or lower, the coding industry has focused on classical turbo code design, which can, in essence, be improved. Because turbo codes have traditionally been designed to maximize the minimum Hamming weight of systematic codewords (where the information part of the codeword has a Hamming weight of two), it is recognized that further coding improvements can be made. At relatively high SNR, this approach yields good codes since two codewords are most easily confused when their information part is differed by two bits, owing to the recursive nature of their constituent codes.

However, for very low SNR where low code rates are traditionally used, an investigation of the erroneous turbo code frames reveals that the number of errors in the information part, is in general, more than two. This observation suggests that by targeting minimum Hamming weight corresponding to information sequences with Hamming weight more than two, the performance of low code rates, in principle, can be enhanced. With improved design, low rate turbo codes can approach the Shannon limit more closely, resulting in a variety of advantages for communication systems such as extended battery lifetime within cellular networks, lower transmit power within satellite communication and broadcasting systems, etc.

Figure 2:
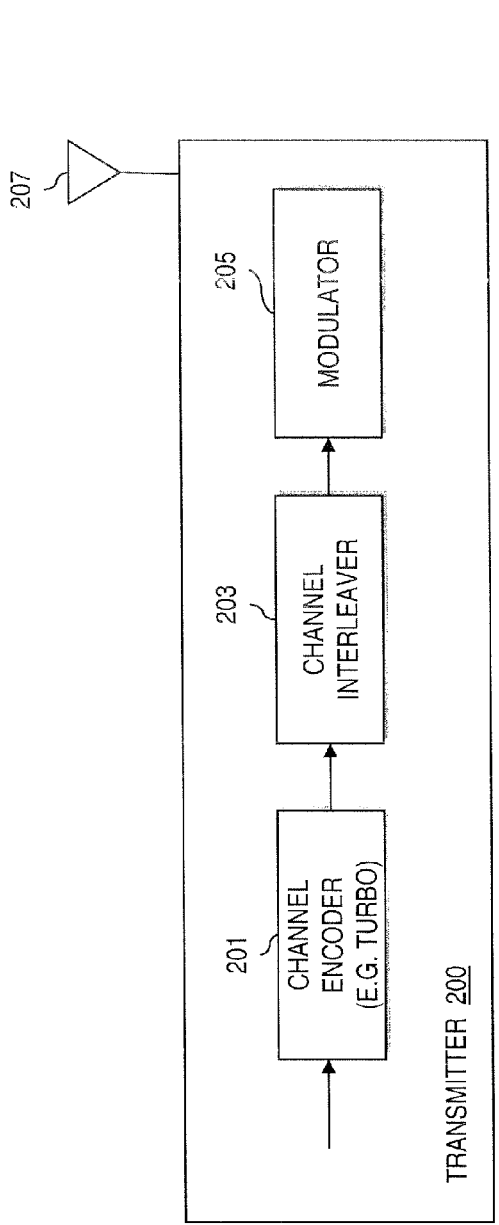
FIG. 2 is a diagram of a transmitter in the system of FIG. 1.
Figure 3:
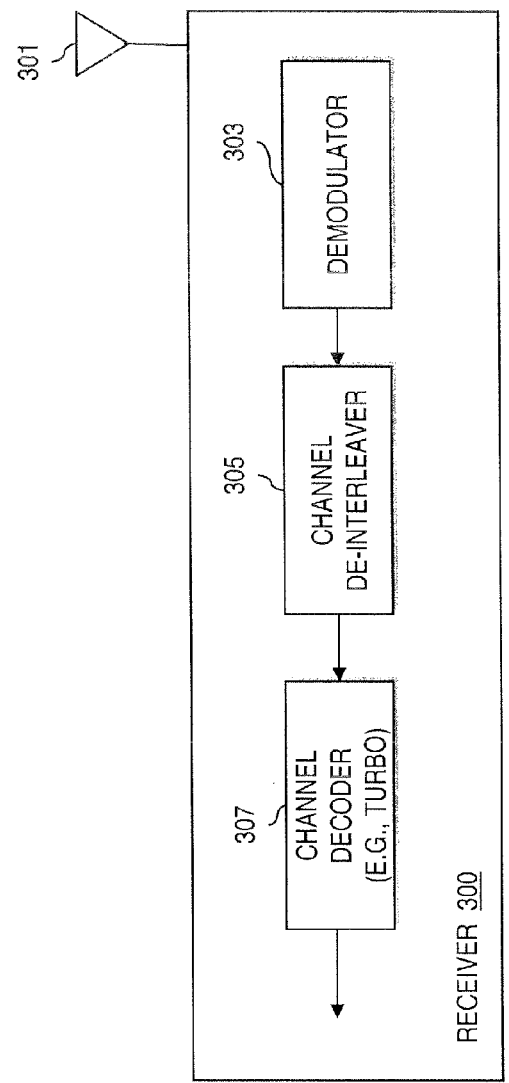
FIG. 3 is a diagram of a receiver in the system of FIG. 1.
Figure 4:
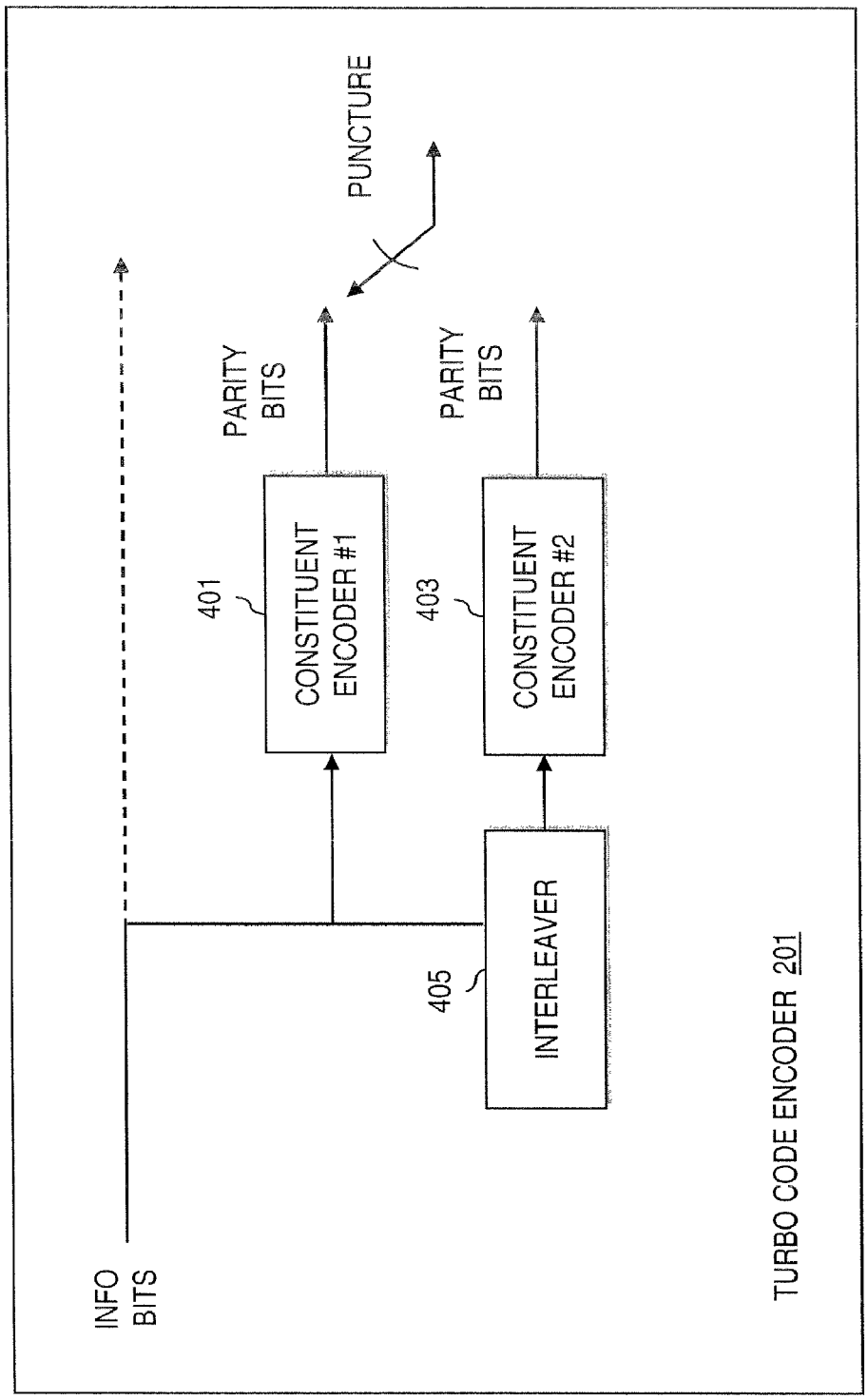
FIG. 4 is a diagram of a turbo code encoder configured to use constituent encoders, in accordance with various exemplary embodiments.

FIG. 2 is a diagram of a transmitter in the system of FIG. 1. As seen in FIG. 2, a transmitter 200 is equipped with a channel encoder (e.g., turbo encoder) 201 that accepts input from an information source and outputs coded stream of higher redundancy suitable for error correction processing at the receiver (as shown in FIG. 3). The information source generates k signals from a discrete alphabet, X. The channel encoder 201 may utilize a combination of a constituent encoder that uses one or more constituent codes and an interleaver 203 to implement the channel coding procedure. Turbo codes are produced by parallel concatenation of two codes (e.g., convolutional codes) with an interleaver in between the encoders (as seen in FIG. 4).

Essentially, the encoder 201 generates signals from alphabet Y to a channel interleaver 203, which scrambles the alphabet. That is, the channel interleaver 203 pseudo-randomizes the code symbols. The scrambled signals are fed to a modulator 205, which maps the encoded messages from encoder 201 to signal waveforms that are transmitted to a transmit antenna 207.

The antenna 207 emits these waveforms over the communication channel 103. Accordingly, the encoded messages are modulated and distributed to a transmit antenna 207.

The transmissions from the transmit antenna 207 propagate to a receiver, as discussed below.

FIG. 3 is a diagram of a receiver in the system of FIG. 1. At the receiving side, a receiver 300 includes an antenna 301 that receives the waveforms emitted over the channel 103. The receiver 300 provides a demodulator 303 that performs demodulation of the received signals. After demodulation, the received signals are forwarded to a channel de-interleaver 305 to unscramble the symbols. A decoder 307 then attempts to reconstruct the original source messages.

It is contemplated that the above transmitter 200 and receiver 300 can be deployed in within a single wireless terminal, in which case a common antenna system can be shared. The wireless terminal can for example be configured to operate within a satellite communication, a cellular system, wireless local area network (WLAN), etc.

FIG. 4 is a diagram of a turbo code encoder configured to use constituent encoders, in accordance with various exemplary embodiments. In this example, turbo encoder 201 employs two constituent encoders 401, 403 and an interleaver 405. Although two encoders 401, 403 are described in this scenario, the encoder 201 can provide more than two encoders to achieve various code rates. As seen in FIG. 4, the turbo encoder 201 can optionally output the information (i.e., systematic) bit as part of the output code, depending on the design of the constituent encoders 401, 403 and the code rates. The operation of the turbo code encoder 201 is explained with respect to FIG. 5, as follows.

Figure 5:
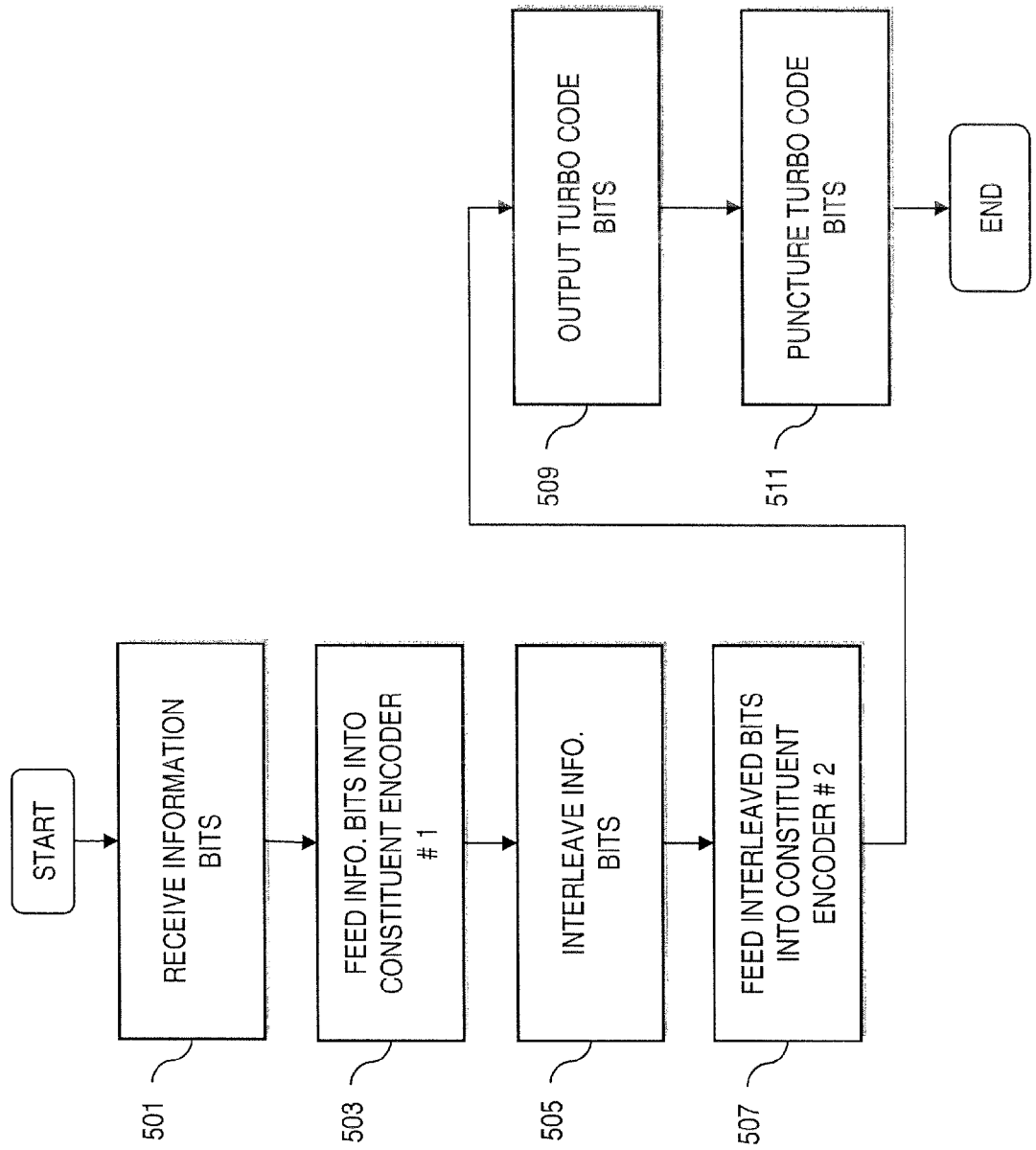
FIG. 5 is a flowchart of a process for turbo code encoding, according to an exemplary embodiment.

FIG. 5 is a flowchart of a process for turbo code encoding, according to an exemplary embodiment. Information bits that are to be turbo code encoded are fed to both constituent encoders 401 and 403 (step 501). The bits that are fed to constituent encoder 403 are, however, interleaved by interleaver 405 prior to being input to constituent encoder 403, as in steps 503-507. In steps 509 and 511, once both bit streams are encoded, the output of constituent encoders 401, 403 is punctured to achieve the desired code rate. According to an exemplary embodiment, the output of turbo encoder 201 can contain the unpunctured bits at the output of constituent encoders 401, 403 and, alternatively, the information bits that have not undergone any processing, as illustrated in FIG. 4.

Figure 6:
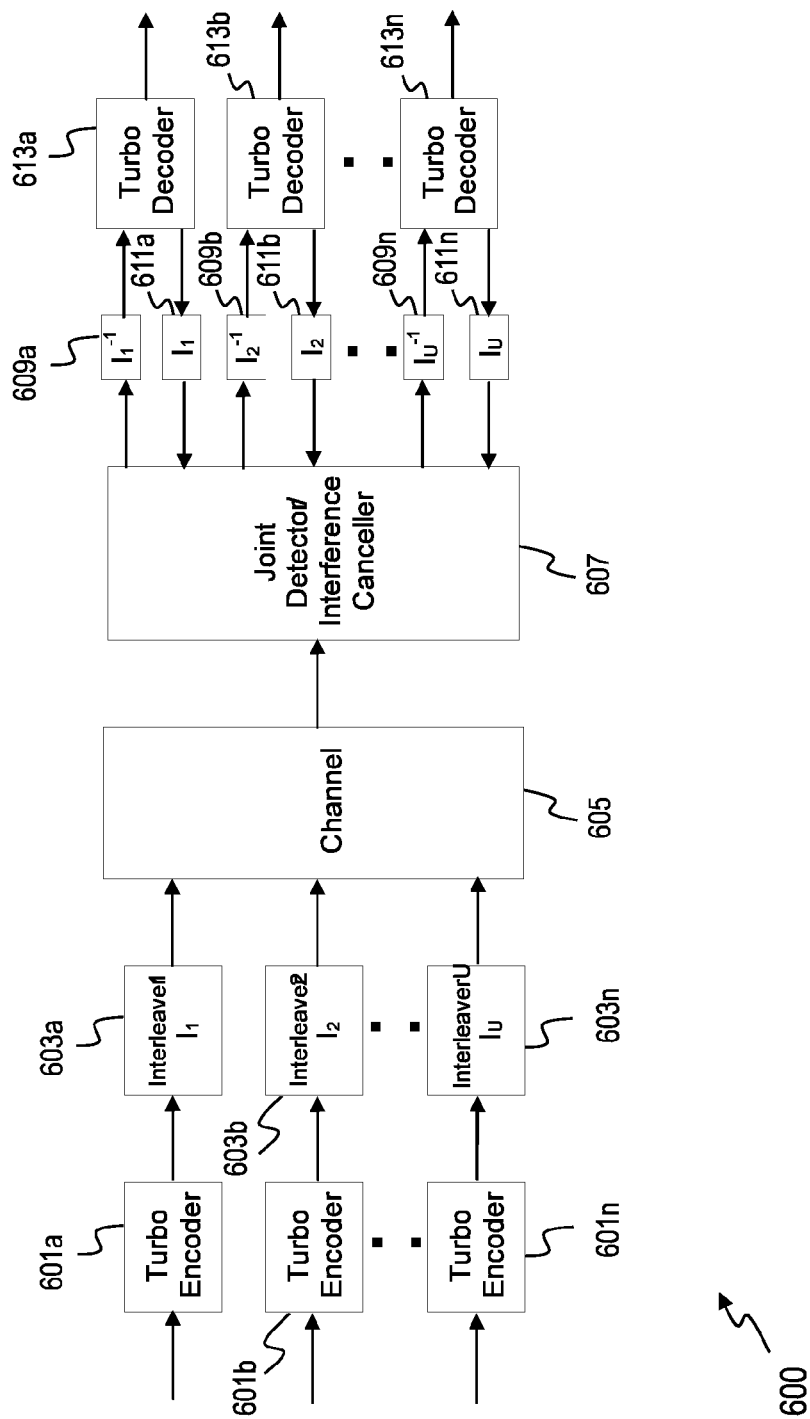
FIG. 6 is a diagram of a system capable of supporting multiple transmitters using an interleave division multiple access (IDMA) scheme employing low rate turbo codes, according to an exemplary embodiment.

FIG. 6 is a diagram of a system capable of supporting multiple transmitters using an interleave division multiple access (IDMA) scheme, according to an exemplary embodiment. For the purposes of illustration, a communication system 600 supports multiple terminals (i.e., users) configured to with respective encoders 601a-601n and interleavers 603a-603n. In an exemplary embodiment, these terminals can be satellite terminals.

Conventional data transmission to and from an ultra small terminal via Ku-band satellite is based on Code Division Multiple Access (CDMA) format using rate ⅓ turbo codes. CDMA format is used to recover part of the bandwidth expansion due to spectrum spreading. However, CDMA trade power efficiency with bandwidth efficiency. Additionally, CDMA systems require all signals accessing the same spectrum at the same time to be of equal power; and system performance is better when the signals are of different power level.

By way of example, the system 600 provides a multiple access scheme, such as IDMA, which achieves good performance with relatively lower receiver complexity compared to CDMA (as the number of users that share the same channel increases). With IDMA, each user sharing the transmission channel is separated by user specific and possibly random interleavers 603a-603n. Also, due to lack of spreading factor and more efficient FEC coding, a fraction of a satellite transponder is needed under the IDMA scheme, thereby lowering the operating cost.

In one embodiment, each of turbo encoders 601a-601n utilizes the same turbo codes. The turbo encoded sequences are then fed to the respective user-specific interleavers 603a-603n. The interleaved sequences are then transmitted over channel 605 to a receiver, which includes a joint detector/interference canceller unit 607 that interacts with the turbo decoders 613a-613n to iteratively produce an estimate of the received codewords. With each iteration, the turbo decoder 613a-613n produces a better estimate to the joint detector/interference canceller 607 for achieving better cancellation. The information exchanged between turbo decoders 613a-613n and the joint detector/interference canceller 607 is interleaved/de-interleaved via interleavers 611a-611n and de-interleavers 609a-609n. Once "good" estimates of the decoded sequences are produced, they are output from the turbo decoders 613a-613n.

Figure 7:
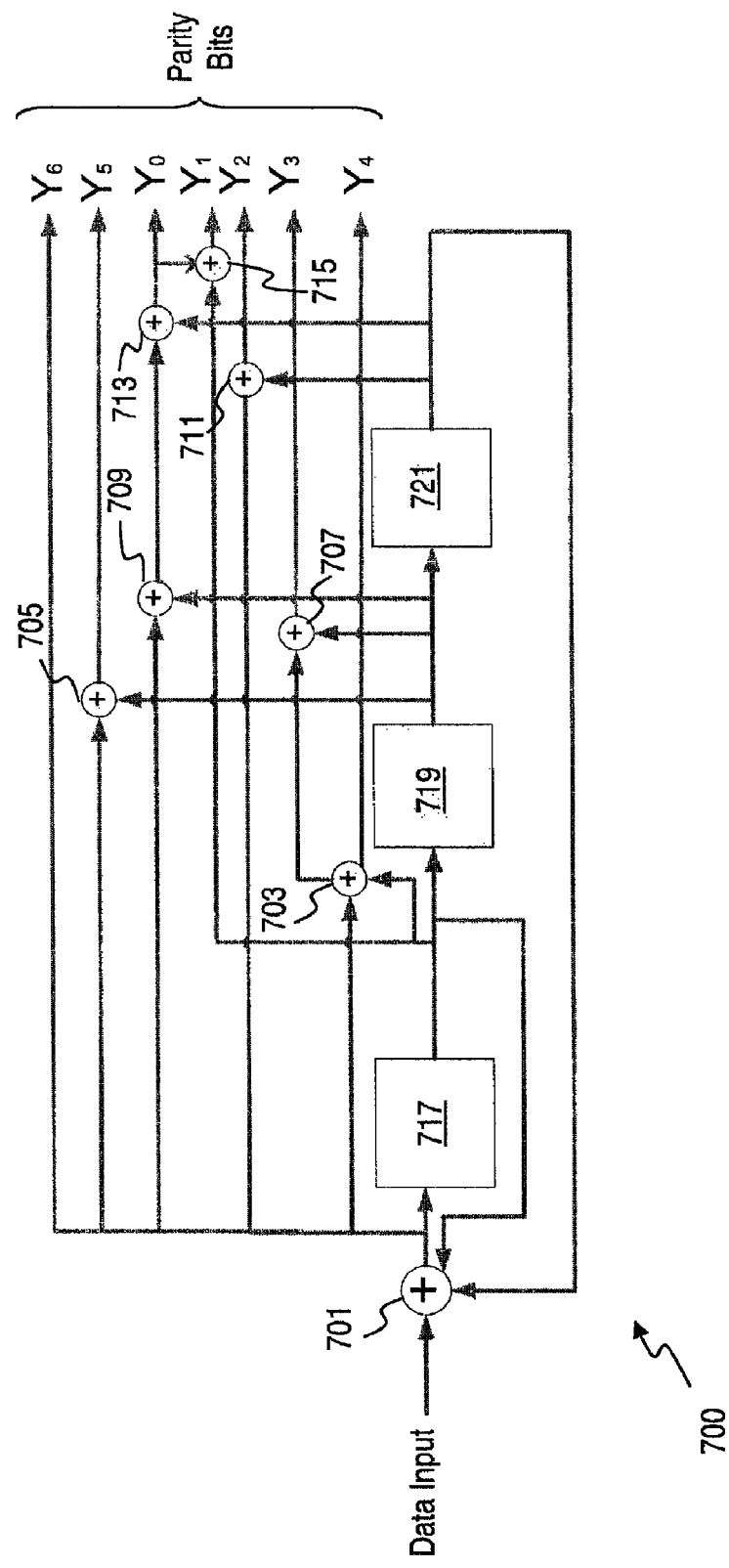
FIGS. 7 and 8 are diagrams of constituent encoders configured to provide low rate turbo codes, in accordance with various exemplary embodiments.
Figure 8:
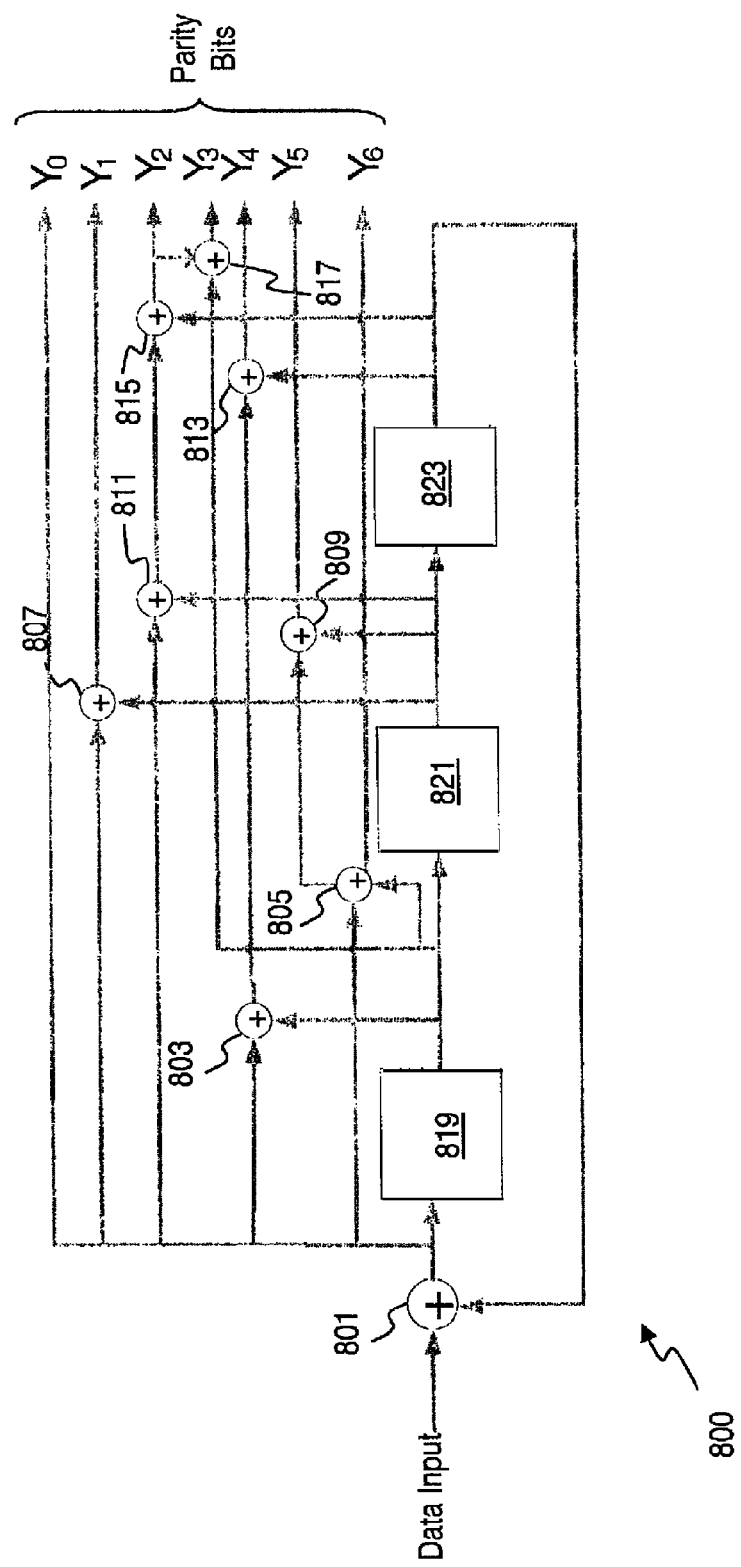

FIGS. 7 and 8 are diagrams of constituent encoders configured to provide low rate turbo codes, in accordance with various exemplary embodiments. A constituent encoder 700 provides code rates of 1/14, 1/12, 1/10, 1/8, 1/6, and 1/4. When implemented in the turbo encoder 201 of FIG. 4, the encoder 201 does not output the information bits given these code rates. For rate 1/14 turbo code, all seven parity bits of the constituent code are transmitted. For rate 1/12 turbo code, $Y_6$ is punctured from both constituent codes, for rate 1/10 turbo code $Y_5$ and $Y_6$ are punctured, for rate 1/8 turbo code, $Y_4$, $Y_5$ and $Y_6$ are punctured, for rate 1/6 turbo code $Y_3$, $Y_4$, $Y_5$ and $Y_6$ are punctured and for rate 1/4 turbo code, $Y_2$, $Y_3$ and $Y_4$, $Y_5$ and $Y_6$ are punctured from both constituent codes. The transfer function of the constituent encoder 700 is given as:

$$G(D) = \left[\frac{n_0(D)}{d(D)}, \frac{n_1(D)}{d(D)}, \ldots \frac{n_6(D)}{d(D)}\right]$$

where, $d(D)=1+D+D^3$ $n_0(D)=1+D^2+D^3$ $n_1(D)=1+D+D^2+D^3$ $n_2(D)=1+D^3$ $n_3(D)=1+D+D^2$ $n_4(D)=1+D$ $n_5(D)=1+D^2$ $n_6(D)=1$ As seen, the logic or circuitry for the encoder 700 encompasses adders 701, 703, 705, 707, 709, 711, 713, and 715 and shift registers 717, 719 and 721. Modular adder 701 receives the data input, adding it together with the output of registers 717 and 721. The output of adder 701 produces the parity bit $Y_6$ and is also fed into adders 703, 711, 709 and 705. Modular adder 703 sums the signals from adder 701 and register 717, resulting in the parity bit $Y_4$; the summed value is additionally provided to adder 707. Adder 705 receives inputs from register 719 and adder 701, and produces the parity bit $Y_5$ at its output.

Further, adder 707 sums the values from adder 703 and register 719 to generate parity bit $Y_3$. Adder 709 receives inputs from register 719 and adder 701 to produce a value, which is then fed into adder 713. Adder 711 adds the value from register 721 as well as the value from adder 701; the resultant value is the parity bit $Y_2$. As for adder 713, this adder 713 produces parity bit $Y_0$ from the summation of a value from adder 709 and register 721. Adder 715 receives inputs from adder 713 and register 721 to generate parity bit $Y_1$.

FIG. 8 shows a block diagram of a constituent encoder 800 for achieving varying code rates, such as 1/15. The transfer function of the constituent encoder 800 is as follows:

$$G(D) = \left[\frac{n_0(D)}{d(D)}, \frac{n_1(D)}{d(D)}, \ldots \frac{n_6(D)}{d(D)}\right]$$

where, $d(D)=1+D^3$ $n_0(D)=1$ $n_1(D)=1+D^2$ $n_2(D)=1+D^2+D^3$ $n_3(D)=1+D+D^2+D^3$ $n_4(D)=1+D+D^3$ $n_5(D)=1+D+D^2$ $n_6(D)=1+D$ To generate the parity bits according to this transfer function, the constituent encoder 800 has circuitry that includes modular adders 801, 803, 805, 807, 809, 811, 813, 815, and 817 and shift registers 819, 821, and 823.

As seen, modular adder 801 adds the output of register 823 with the data input and generates parity bit $Y_0$, which is also supplied into adders 805, 803, 811, and 807. Adder 803 receives input from adder 801 and register 819, summing these inputs for a resultant value that is fed into adder 813. At adder 805, signals from adder 801 and register 819 are summed to yield parity bit $Y_6$—which is also fed into adder 809.

Adder 807 adds the input from adder 801 and the input from register 821, to provide parity bit $Y_1$. Parity bit $Y_5$ can be generated through the summation, at adder 809, of the values from adder 805 and register 821. With respect to adder 811, inputs from adder 801 and register 821 are added by adder 811 and provided to adder 815. Adder 813 receives input from adder 803 and register 823 to generate parity bit $Y_4$. Parity bit $Y_2$ is formed by the addition of the result from adder 811 and content of register 823. Adder 817 receives inputs from adder 815 and register 819 and produces parity bit $Y_3$ at its output. Under this arrangement (i.e., code rate of 1/15), the turbo encoder 201 of FIG. 4 outputs the systematic bit, by contrast to the constituent encoders 700, 800 of FIGS. 7 and 8, respectively, in which no information bit is output by the turbo encoder 201.

It should be noted that, according to certain embodiments, the low rate turbo codes described herein have been developed by targeting minimum Hamming weight corresponding to information sequences with Hamming weight more than two. Using this approach, a search for new turbo codes was conducted using a uniform interleaving assumption and constraining the Hamming weight of input sequences to a maximum of six, for instance.

Figure 9A:
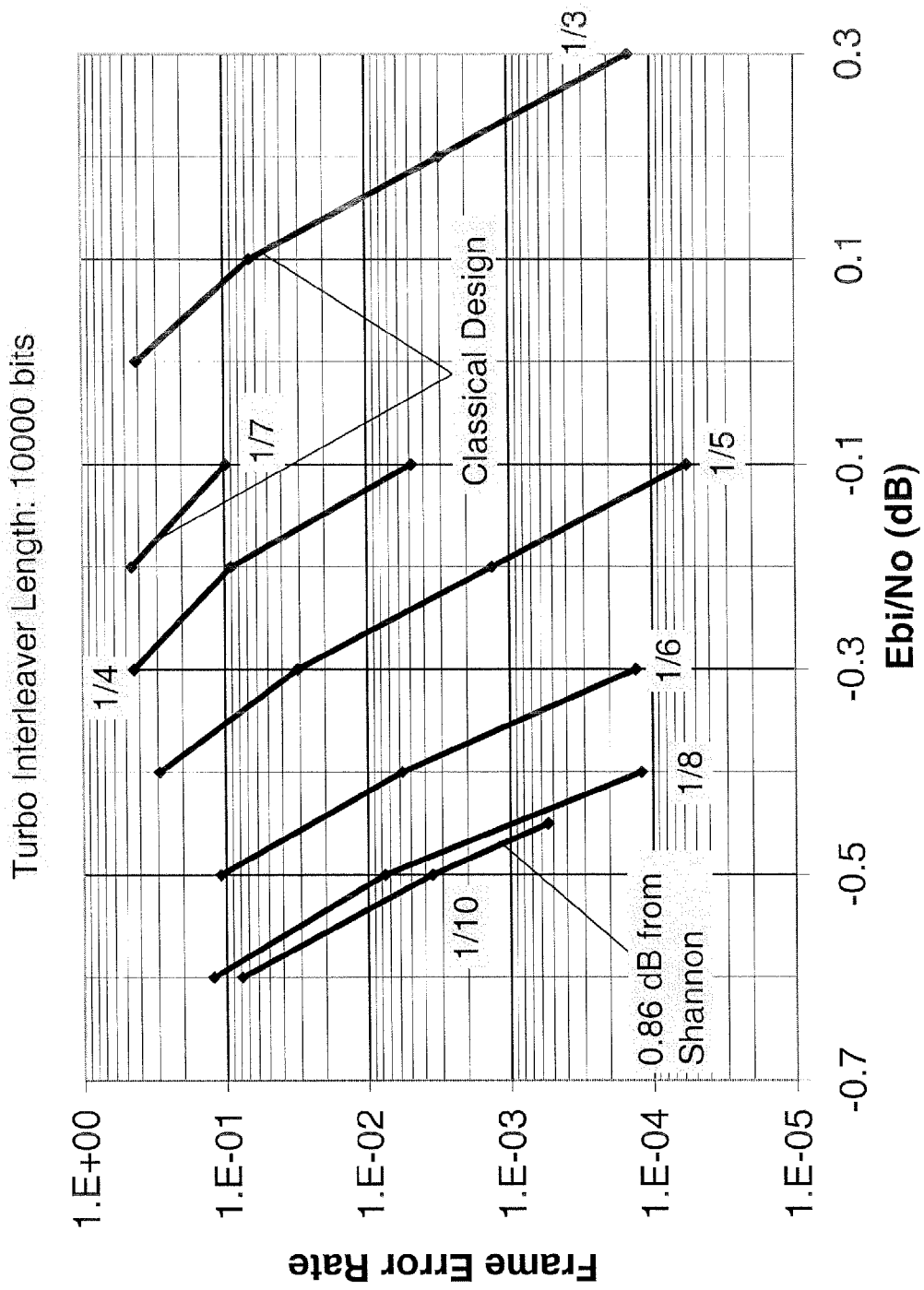
FIGS. 9A-9E are graphs illustrating the performance of low rate turbo codes generated by the constituent encoders of FIGS. 7 and 8.
Figure 9B:
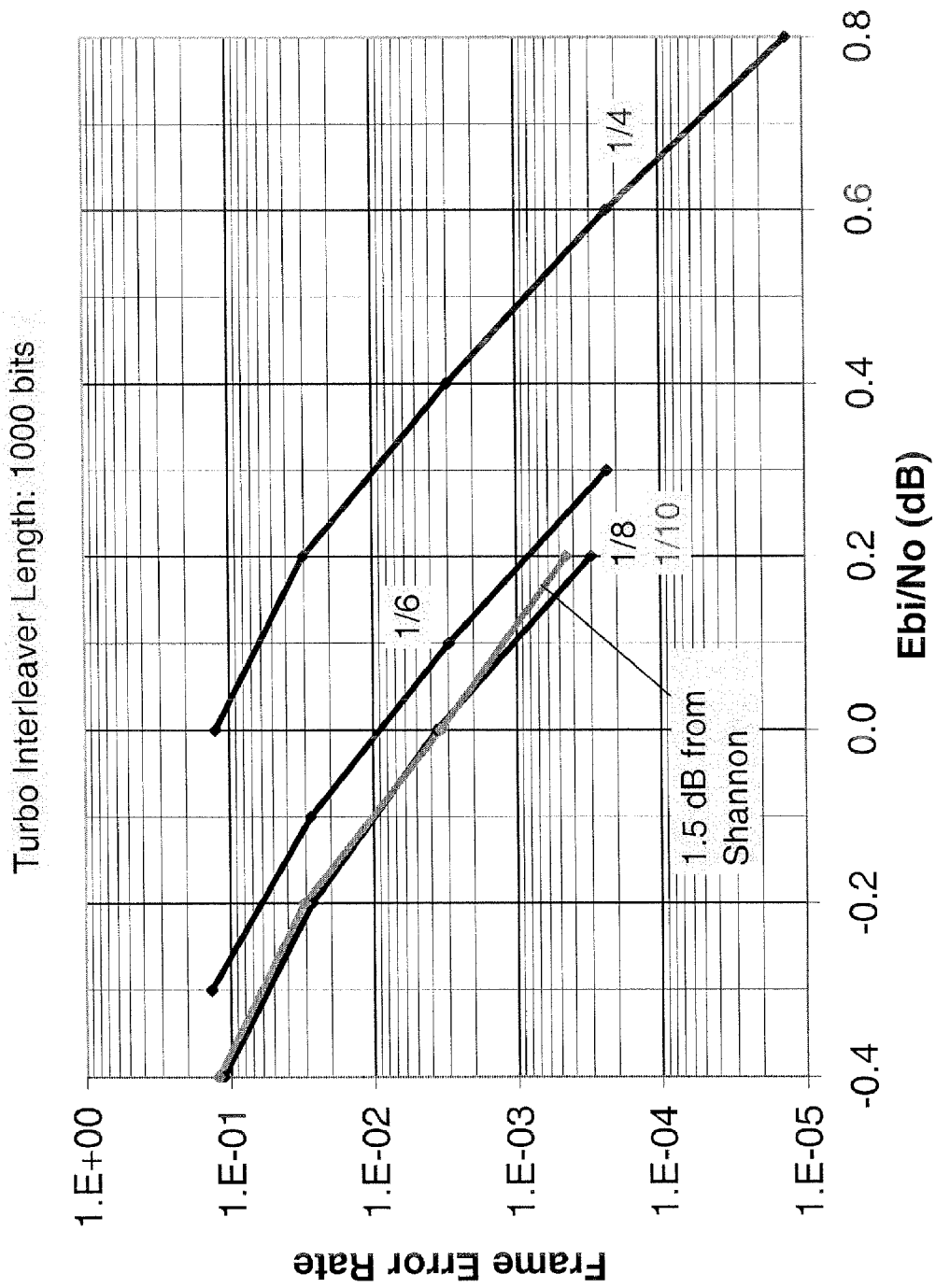

FIGS. 9A-9E are graphs illustrating the performance of low rate turbo codes generated by the constituent encoders of FIGS. 7 and 8. FIGS. 9A and 9B illustrate the performance of the turbo codes described in FIG. 7 with interleaver sizes of 10,000 and 1000 bits, respectively. An apparent performance advantage of these low rate codes with respect to conventional turbo codes based on classical turbo code design is shown in FIG. 9A, where the new rate 1/6 turbo code outperforms a rate 1/7 classical design turbo code by 0.4 dB for an interleaver size of 10,000 bits.

Figure 9C:
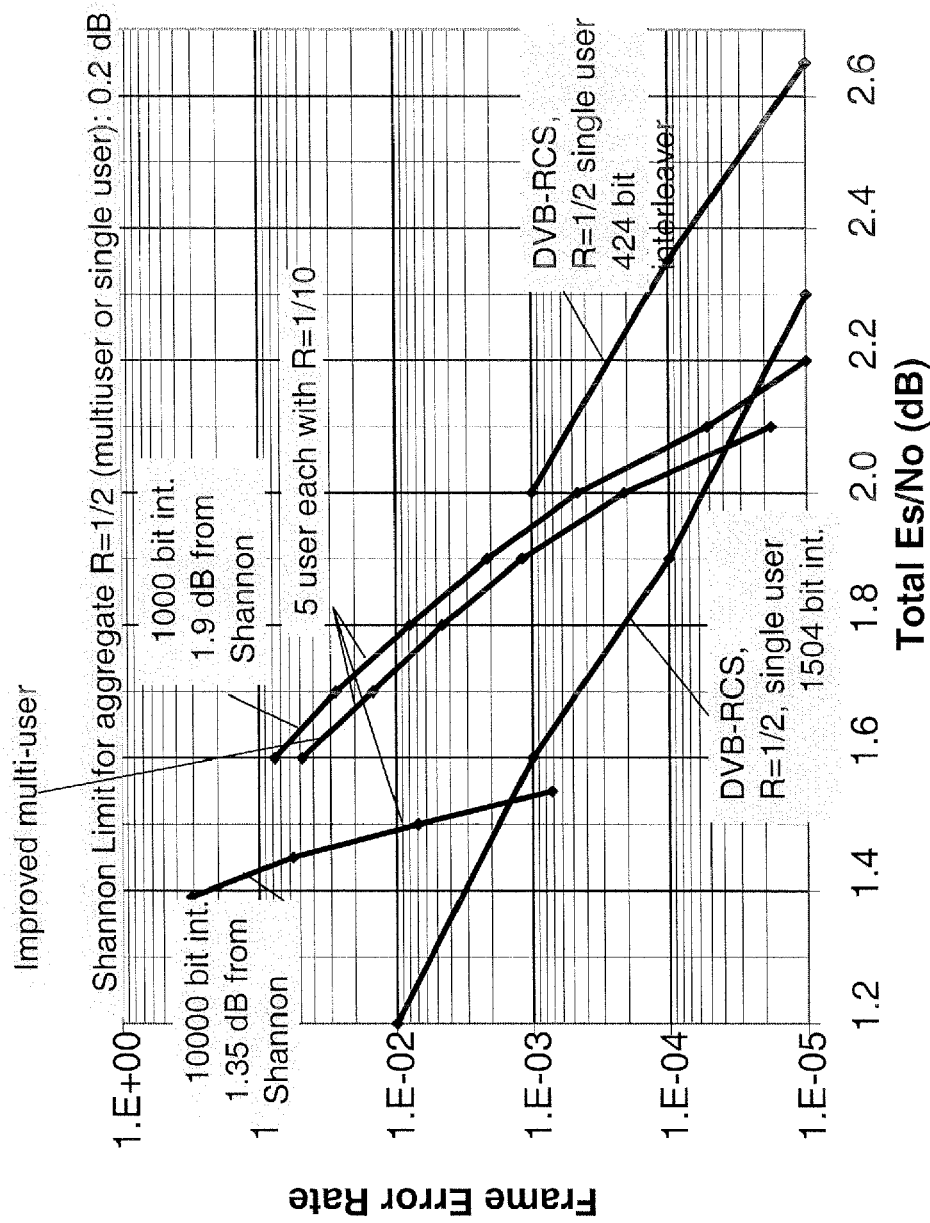

FIG. 9C illustrates the additive white Gaussian noise (AWGN) performance in a scenario where five users are sharing a communication channel, each operating with a code rate of 1/10. The aggregate performance is only 1.35 dB away from the single (or multiple) user Shannon limit for the corresponding throughput (1 bit/QPSK symbol in this example) and outperforms, for example, single user Digital Video Broadcasting-Return Channel via Satellite (DVB-RCS) codes.

Figure 9D:
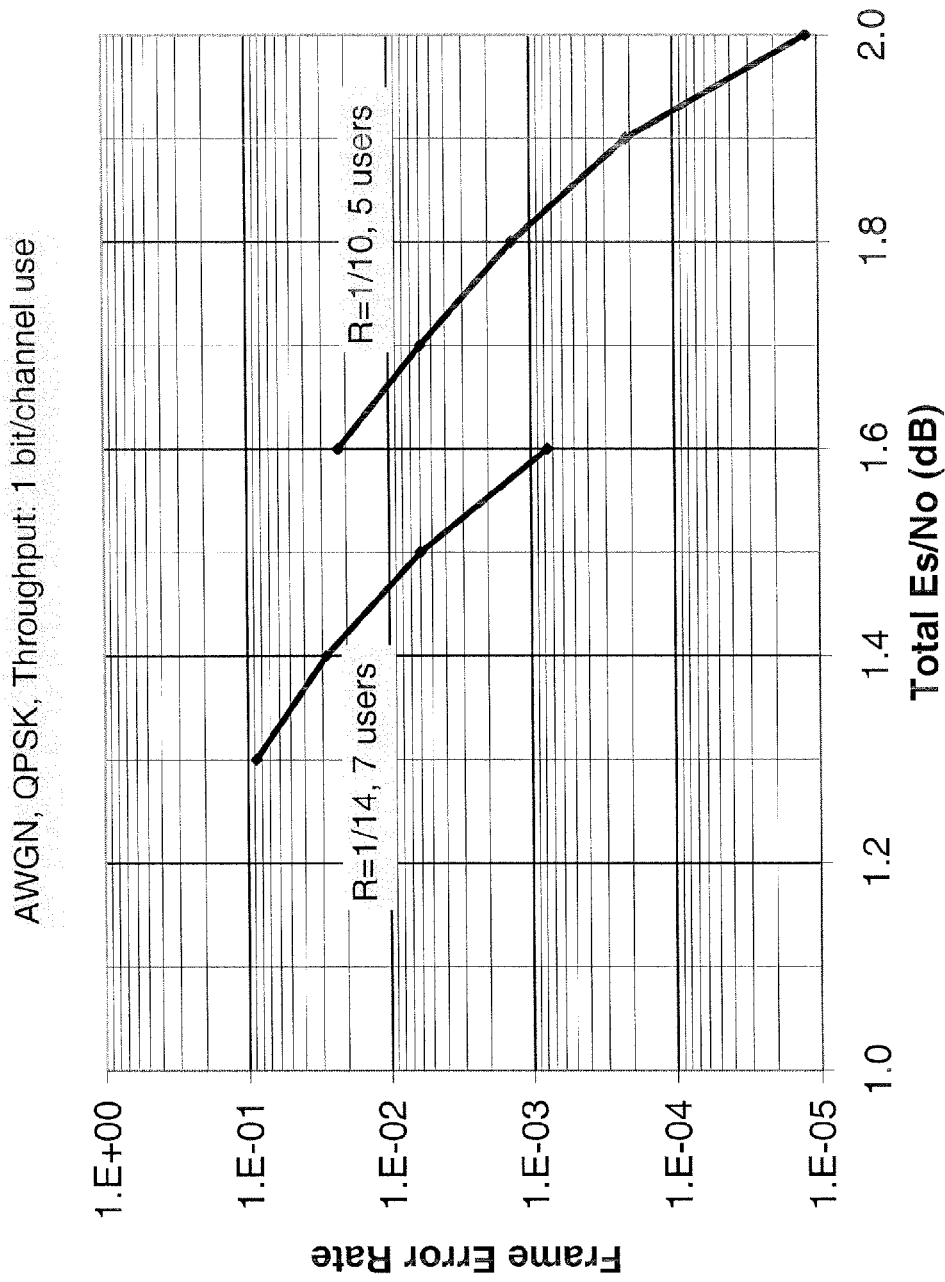

As shown in FIG. 9D, another 0.25 dB can be saved by using rate 1/14 codes with 7 users without sacrificing total throughput with respect to the rate 1/10, 5 user case.

Figure 9E:
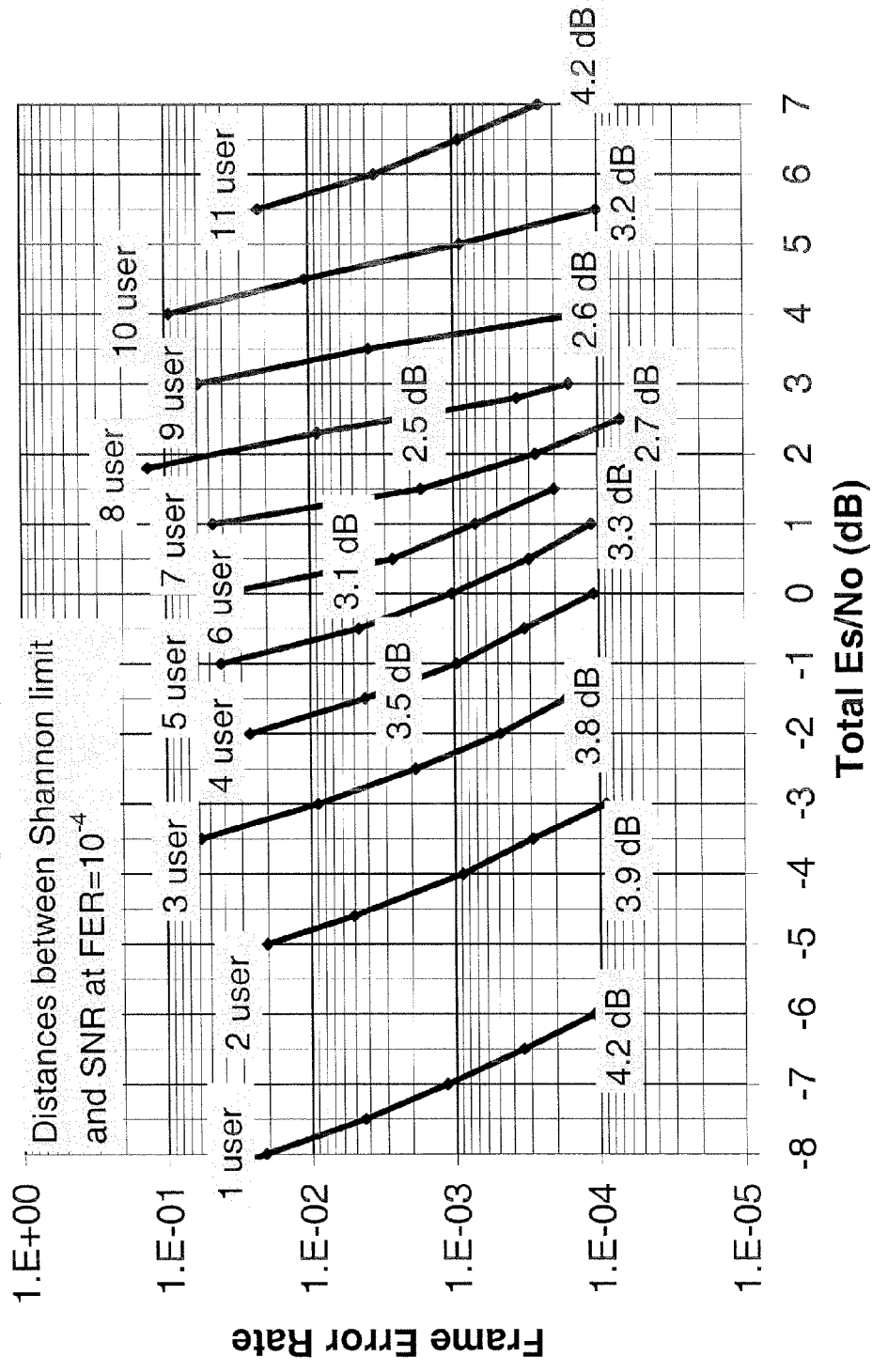

FIG. 9E illustrates the performance of the rate 1/15 code described in FIG. 8, where each user is using the same constituent code in an IDMA environment.

The processes described herein for generating low rate codes may be implemented via software, hardware (e.g., general processor, Digital Signal Processing (DSP) chip, an Application Specific Integrated Circuit (ASIC), Field Programmable Gate Arrays (FPGAs), etc.), firmware or a combination thereof. Such exemplary hardware for performing the described functions is detailed below.

Figure 10:
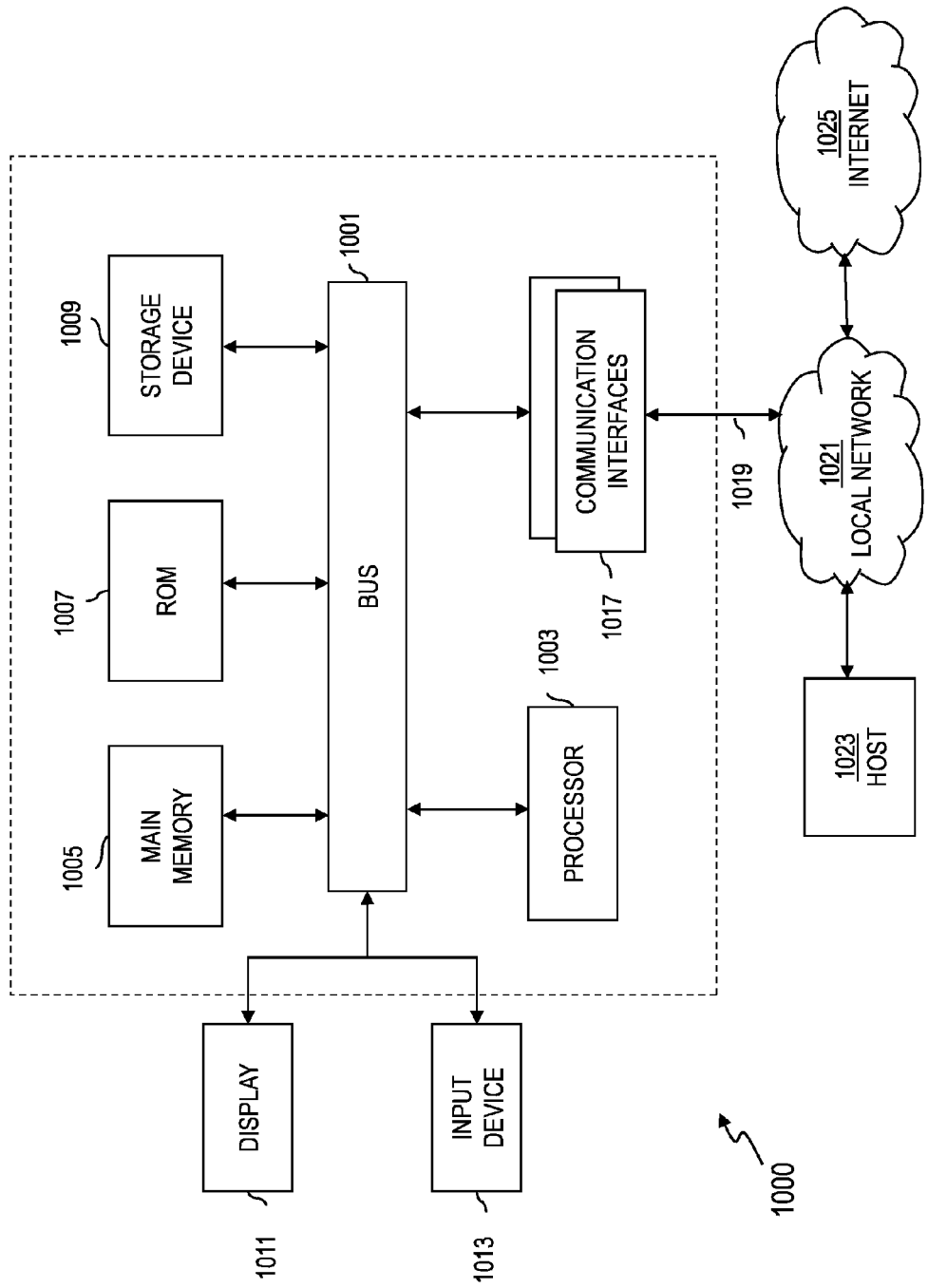
FIG. 10 is a diagram of a computing system that can perform the various embodiments of the present invention.

FIG. 10 illustrates a computer system 1000 upon which an embodiment according to the present invention can be implemented. The computer system 1000 includes a bus 1001 or other communication mechanism for communicating information and a processor 1003 coupled to the bus 1001 for processing information. The computer system 1000 also includes main memory 1005, such as a random access memory (RAM) or other dynamic storage device, coupled to the bus 1001 for storing information and instructions to be executed by the processor 1003. Main memory 1005 can also be used for storing temporary variables or other intermediate information during execution of instructions by the processor 1003. The computer system 1000 may further include a read only memory (ROM) 1007 or other static storage device coupled to the bus 1001 for storing static information and instructions for the processor 1003. A storage device 1009, such as a magnetic disk or optical disk, is coupled to the bus 1001 for persistently storing information and instructions.

The computer system 1000 may be coupled via the bus 1001 to a display 1011, such as a cathode ray tube (CRT), liquid crystal display, active matrix display, or plasma display, for displaying information to a computer user. An input device 1013, such as a keyboard including alphanumeric and other keys, is coupled to the bus 1001 for communicating information and command selections to the processor 1003. Another type of user input device is a cursor control 1015, such as a mouse, a trackball, or cursor direction keys, for communicating direction information and command selections to the processor 1003 and for controlling cursor movement on the display 1011.

According to one embodiment of the invention, the modules of the system of FIG. 4 is implemented by the computer system 1000 in response to the processor 1003 executing an arrangement of instructions contained in main memory 1005. Such instructions can be read into main memory 1005 from another computer-readable medium, such as the storage device 1009. Execution of the arrangement of instructions contained in main memory 1005 causes the processor 1003 to perform the process steps described herein. One or more processors in a multi-processing arrangement may also be employed to execute the instructions contained in main memory 1005. In alternative embodiments, hard-wired circuitry may be used in place of or in combination with software instructions to implement the embodiment of the present invention. Thus, embodiments of the present invention are not limited to any specific combination of hardware circuitry and software.

The computer system 1000 also includes a communication interface 1017 coupled to bus 1001. The communication interface 1017 provides a two-way data communication coupling to a network link 1019 connected to a local network 1021. For example, the communication interface 1017 may be a digital subscriber line (DSL) card or modem, an integrated services digital network (ISDN) card, a cable modem, a telephone modem, or any other communication interface to provide a data communication connection to a corresponding type of communication line. As another example, communication interface 1017 may be a local area network (LAN) card (e.g. for Ethernet™ or an Asynchronous Transfer Model (ATM) network) to provide a data communication connection to a compatible LAN. Wireless links can also be implemented. In any such implementation, communication interface 1017 sends and receives electrical, electromagnetic, or optical signals that carry digital data streams representing various types of information. Further, the communication interface 1017 can include peripheral interface devices, such as a Universal Serial Bus (USB) interface, a PCMCIA (Personal Computer Memory Card International Association) interface, etc. Although a single communication interface 1017 is depicted in FIG. 10, multiple communication interfaces can also be employed.

The network link 1019 typically provides data communication through one or more networks to other data devices. For example, the network link 1019 may provide a connection through local network 1021 to a host computer 1023, which has connectivity to a network 1025 (e.g. a wide area network (WAN) or the global packet data communication network now commonly referred to as the "Internet") or to data equipment operated by a service provider. The local network 1021 and the network 1025 both use electrical, electromagnetic, or optical signals to convey information and instructions. The signals through the various networks and the signals on the network link 1019 and through the communication interface 1017, which communicate digital data with the computer system 1000, are exemplary forms of carrier waves bearing the information and instructions.

The computer system 1000 can send messages and receive data, including program code, through the network(s), the network link 1019, and the communication interface 1017. In the Internet example, a server (not shown) might transmit requested code belonging to an application program for implementing an embodiment of the present invention through the network 1025, the local network 1021 and the communication interface 1017. The processor 1003 may execute the transmitted code while being received and/or store the code in the storage device 1009, or other non-volatile storage for later execution. In this manner, the computer system 1000 may obtain application code in the form of a carrier wave.

The term "computer-readable medium" as used herein refers to any medium that participates in providing instructions to the processor 1003 for execution. Such a medium may take many forms, including but not limited to non-volatile media, volatile media, and transmission media. Non-volatile media include, for example, optical or magnetic disks, such as the storage device 1009. Volatile media include dynamic memory, such as main memory 1005. Transmission media include coaxial cables, copper wire and fiber optics, including the wires that comprise the bus 1001. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistant (PDA) or a laptop. An infrared detector on the portable computing device receives the information and instructions borne by the infrared signal and places the data on a bus. The bus conveys the data to main memory, from which a processor retrieves and executes the instructions. The instructions received by main memory can optionally be stored on storage device either before or after execution by processor.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method comprising:
encoding information bits to output a coded signal using turbo code encoding with a low code rate, wherein the encoding utilizes constituent encoding having a transfer function:

$$G(D) = \left[\frac{n_0(D)}{d(D)}, \frac{n_1(D)}{d(D)}, \ldots \frac{n_4(D)}{d(D)}\right]$$

where, $d(D)=1+D+D^3$ $n_0(D)=1+D^2+D^3$ $n_1(D)=1+D+D^2+D^3$ $n_2(D)=1+D^3$ $n_3(D)=1+D+D^2$ $n_4(D)=1+D.$ 2. The method according to claim 1, wherein the information bits are encoding by a plurality of constituent encoders utilizing identical transfer functions.

3. The method according to claim 1, wherein the low code rate includes rate 1/14, rate 1/12, rate 1/10, rate 1/8, rate 1/6, or rate 1/4.

4. A device configured to perform the method of claim 1.

5. A method comprising:
encoding information bits to output a coded signal using turbo code encoding with a low code rate, wherein the encoding utilizes constituent encoding having a transfer function, $$G(D) = \left[\frac{n_0(D)}{d(D)}, \frac{n_1(D)}{d(D)}, \ldots \frac{n_6(D)}{d(D)}\right],$$

where, $d(D)=1+D^3$ $n_0(D)=1$ $n_1(D)=1+D^2$ $n_2(D)=1+D^2+D^3$ $n_3(D)=1+D+D^2+D^3$ $n_4(D)=1+D+D^3$ $n_5(D)=1+D+D^2$ $n_6(D)=1+D.$ 6. The method according to claim 5, wherein the information bits are encoding by a plurality of constituent encoders utilizing identical transfer functions.

7. The method according to claim 5, wherein the code rate include rate 1/15.

8. A device configured to perform the method of claim 5.

9. A system comprising:
a detector configured to receive encoded signals from a plurality of terminals each configured to encode information bits to output a coded signal using turbo code encoding with a low code rate; and
a plurality of turbo code decoders configured to exchange information with the detector to decode the encoded signals, wherein the turbo encoding utilized one of a plurality of transfer functions specified according to the following:

$$G(D) = \left[\frac{n_0(D)}{d(D)}, \frac{n_1(D)}{d(D)}, \ldots \frac{n_4(D)}{d(D)}\right]$$

where, $d(D)=1+D+D^3$ $n_0(D)=1+D^2+D^3$ $n_1(D)=1+D+D^2+D^3$ $n_2(D)=1+D^3$ $n_3(D)=1+D+D^2$ $n_4(D)=1+D$ and $$G(D) = \left[\frac{n_0(D)}{d(D)}, \frac{n_1(D)}{d(D)}, \ldots \frac{n_6(D)}{d(D)}\right]$$

where, $d(D)=1+D^3$ $n_0(D)=1$ $n_1(D)=1+D^2$ $n_2(D)=1+D^2+D^3$ $n_3(D)=1+D+D^2+D^3$ $n_4(D)=1+D+D^3$ $n_5(D)=1+D+D^2$ $n_6(D)=1+D.$ 10. The system according to claim 9, wherein the low code rate includes rate 1/15, rate 1/14, rate 1/12, rate 1/10, rate 1/8, rate 1/6, or rate 1/4.

11. The system according to claim 9, wherein the terminals operate according to an interleave division multiple access (IDMA) scheme, the system further comprising:
 a plurality of interleavers configured to interleave bits from the detector to the decoders; and
 a plurality of de-interleavers configured to de-interleave bits from the detector and to output the de-interleaved bits to the decoders.

12. The system according to claim 9, wherein the detector is further configured to cancel interference from the received encoded signals.

13. A method comprising:
 receiving encoded signals from a plurality of terminals each configured to encode information bits to output a coded signal using turbo code encoding with a low code rate; and
 decoding the encoded signals, wherein the turbo encoding utilized one of a plurality of transfer functions specified according to the following:

$$G(D) = \left[\frac{n_0(D)}{d(D)}, \frac{n_1(D)}{d(D)}, \ldots \frac{n_4(D)}{d(D)}\right]$$

where,
$d(D) = 1 + D + D^3$
$n_0(D) = 1 + D^2 + D^3$
$n_1(D) = 1 + D + D^2 + D^3$
$n_2(D) = 1 + D^3$
$n_3(D) = 1 + D + D^2$
$n_4(D) = 1 + D.$
and $$G(D) = \left[\frac{n_0(D)}{d(D)}, \frac{n_1(D)}{d(D)}, \ldots \frac{n_6(D)}{d(D)}\right]$$

where,
$d(D) = 1 + D^3$
$n_0(D) = 1$
$n_1(D) = 1 + D^2$
$n_2(D) = 1 + D^2 + D^3$
$n_3(D) = 1 + D + D^2 + D^3$
$n_4(D) = 1 + D + D^3$
$n_5(D) = 1 + D + D^2$
$n_6(D) = 1 + D.$ 14. The method according to claim 13, wherein the low code rate includes rate 1/15, rate 1/14, rate 1/12, rate 1/10, rate 1/8, rate 1/6, or rate 1/4.

15. The method according to claim 13, wherein the terminals operate according to an interleave division multiple access (IDMA) scheme, the method further comprising:
 interleaving bits corresponding to the encoded signals;
 de-interleaving bits corresponding to the encoded signals; and
 outputting the de-interleaved bits to a plurality of decoders.

\* \* \* \* \*